United States Patent [19]

Peters

[11] Patent Number: 4,973,256
[45] Date of Patent: Nov. 27, 1990

[54] DEVICE UNDER TEST INTERFACE BOARD AND TEST ELECTRONIC CARD INTERCONNECTION IN SEMICONDUCTOR TEST SYSTEM

[75] Inventor: Alfred C. Peters, Garland, Tex.

[73] Assignee: Texas Instruments Incorporated, Dallas, Tex.

[21] Appl. No.: 395,924

[22] Filed: Aug. 18, 1989

[51] Int. Cl.$^5$ .............................................. H01R 9/09
[52] U.S. Cl. .......................................... 439/66; 439/91; 324/158 F
[58] Field of Search .................. 439/55, 65, 66, 74, 439/75, 81, 86, 91; 324/158 F, 158 P

[56] References Cited

U.S. PATENT DOCUMENTS

| | | | |
|---|---|---|---|
| 3,221,286 | 11/1965 | Fedde | 439/65 X |
| 4,421,370 | 12/1983 | Treakle et al. | 439/91 |
| 4,818,241 | 4/1989 | Smoot | 439/65 |
| 4,850,883 | 7/1989 | Kabadi | 439/65 X |

FOREIGN PATENT DOCUMENTS 0544028  1/1977  U.S.S.R. ................. 439/86

Primary Examiner—Neil Abrams
Assistant Examiner—Khiem Nguyen
Attorney, Agent, or Firm—B. Peter Barndt; Melvin Sharp; James T. Comfort

[57] ABSTRACT

An elastomer connector in combination with a mounting card and retaining part minimizes the distance between tester electronics and the semiconductor device under test and proves a means of adjusting the connector impedance.

7 Claims, 4 Drawing Sheets

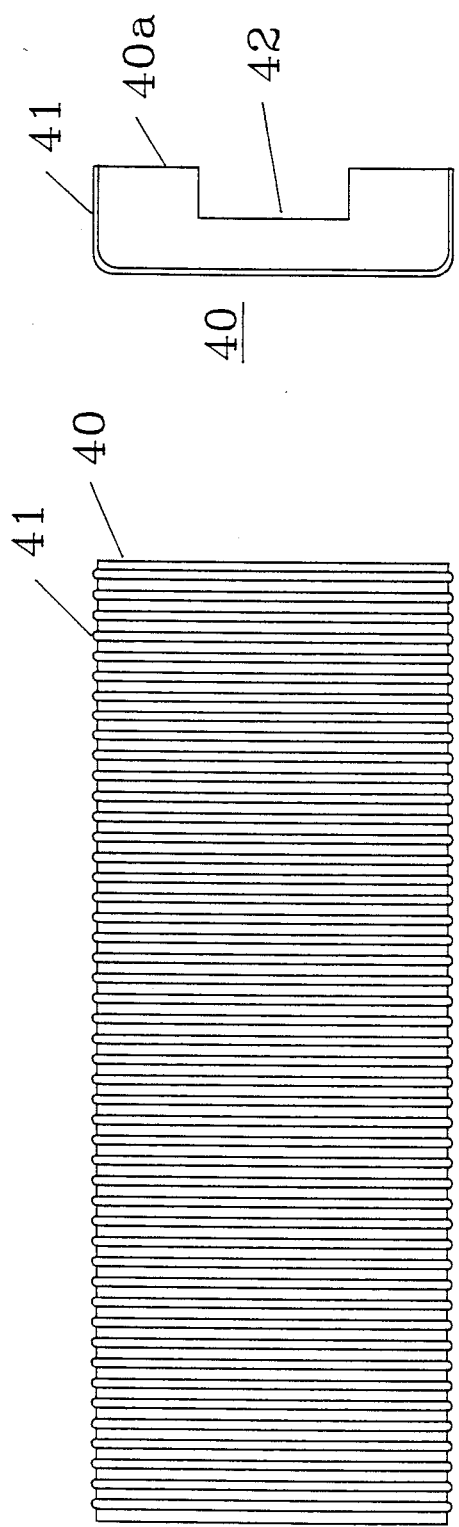
FIGURE 3a
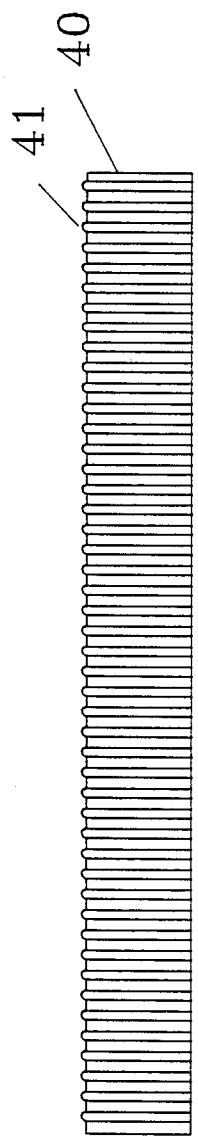
FIGURE 3b
FIGURE 3c

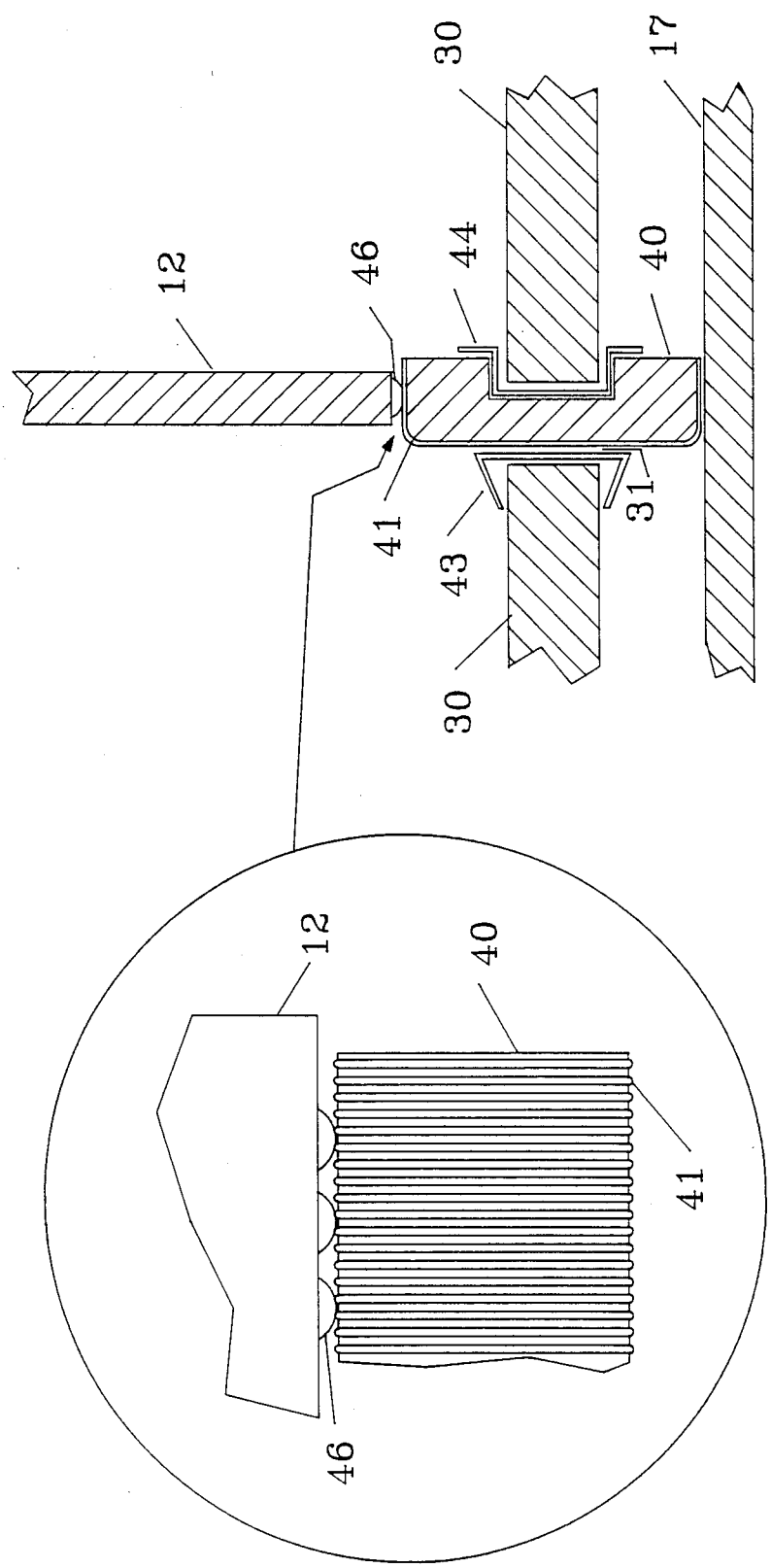

DEVICE UNDER TEST INTERFACE BOARD AND TEST ELECTRONIC CARD INTERCONNECTION IN SEMICONDUCTOR TEST SYSTEM

FIELD OF THE INVENTION

This invention relates to semiconductor test systems, and more particularly to the interconnection between the device under test interface board and the pin electronics in such test systems.

BACKGROUND OF THE INVENTION

In semiconductor device test systems it is of great importance to maintain signal integrity from the pin electronics, the electronics that applies and monitors test signals to and from each pin of the device under test, to the device under test. This is accomplished by keeping the lead length from the pin electronics to the pin of the device under test short, and controlling the impedance of the lead.

BRIEF SUMMARY OF THE INVENTION

The present invention provides a short lead length by using an elastomer connector. A plurality elastomer connectors are positioned in a circular array and held in a vertical position by a ring board. The elastomer connectors are held in the ring board such that the connector remains in a vertical position when a probe card or pin electronics card is removed from the tester. The elastomer is held in position during compression with an insulating support on the conducting side, and a conductive support on the dielectric side. This forms a stripline transmission line that can be used to control the impedance through the elastomer connector.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIGS. 3a, 3b, and 3c illustrate the top, end and side views of the elastomer connector;

FIG. 5 a cross-sectional view of a elastomer connector connecting a pin electrons card and a probe card.

FIG. 5a is an enlarged portion of FIG. 5 showing the pin electronics card contacts connecting the conductors of the elastomer connector.

DESCRIPTION OF A PREFERRED EMBODIMENT OF THE INVENTION

Figure 1:
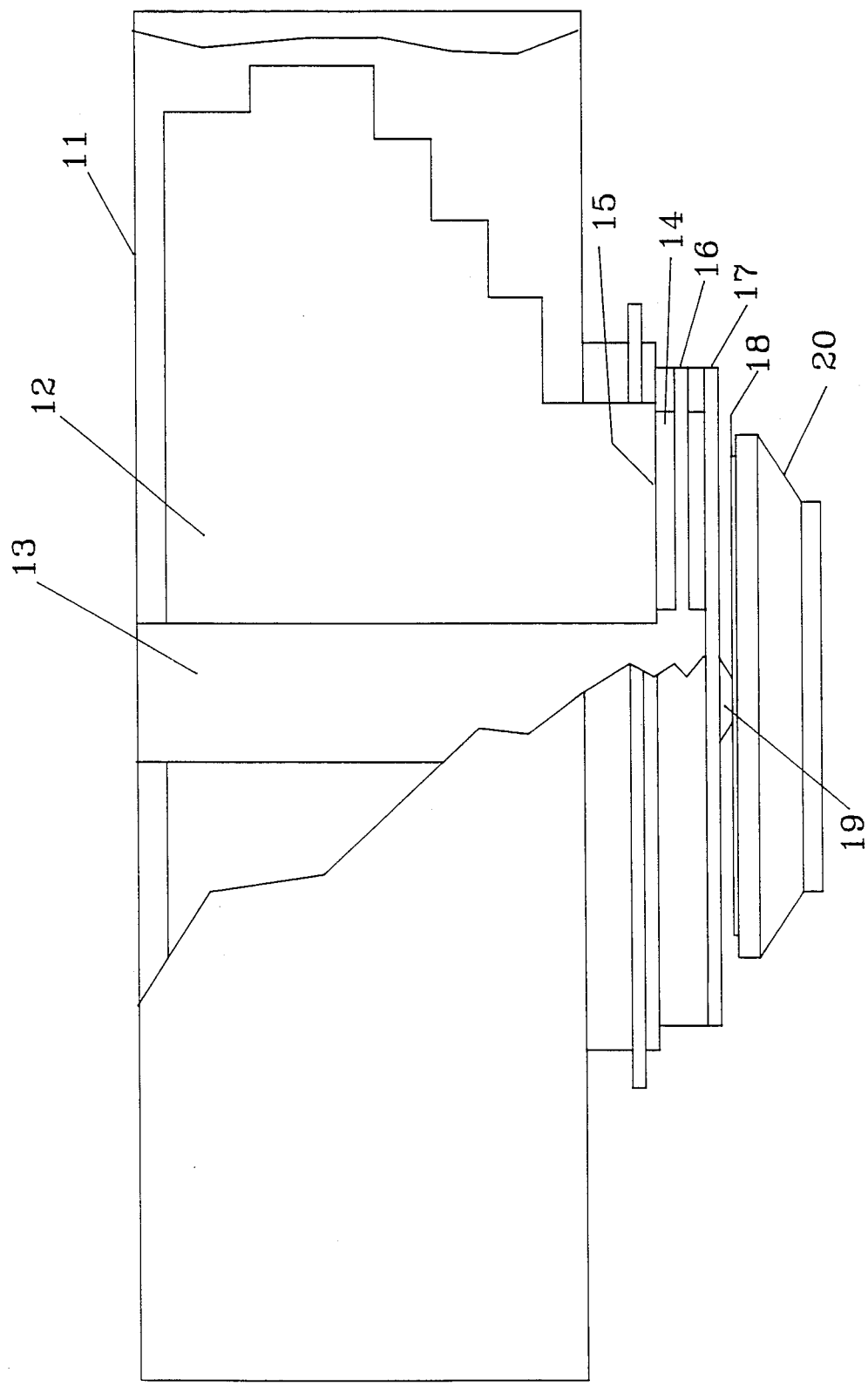
FIG. 1 illustrates the use and positioning of the elastomer connector in a test system.

FIG. 1 illustrates a part 10 of a semiconductor test system. Illustrated is a carrier 11 for pin electronics cards that are used to apply and monitor test signals to and from a semiconductor device under test (DUT). Card 12 is mounted in carrier 11 and is held in place, in part, by center post 13. Center post 13 has grooves, or card guides, extending along its length, not illustrated, into which one edge of each of a plurality of pin electronics cards 12 are placed. Center post 13 holds the cards 12 in an upright position and positions the card over an elastomer connector 14. Pin electronics card 12 has a plurality of contacts (See FIG. 5a) which interconnect with the conductors, at interface 15, on elastomer connector 14.

Elastomer connector 14 provides the interconnection between the pin electronics card 12 and the DUT interface board 17. The DUT interface board can be a probe card, as shown in FIG. 1, for applications receiving direct probing of wafers. Other types of DUT interface boards can be used to interface the test head to automatic (packaged) device handlers or hand test sockets. Probe card 17 has a probe 19 thereon which may have one or more contacts to interface with semiconductor wafer 18. Wafer 18 resides on carrier 20 which is movable to position each of the semiconductor devices (not illustrated) on wafer 18 under probe 19.

Figure 2:
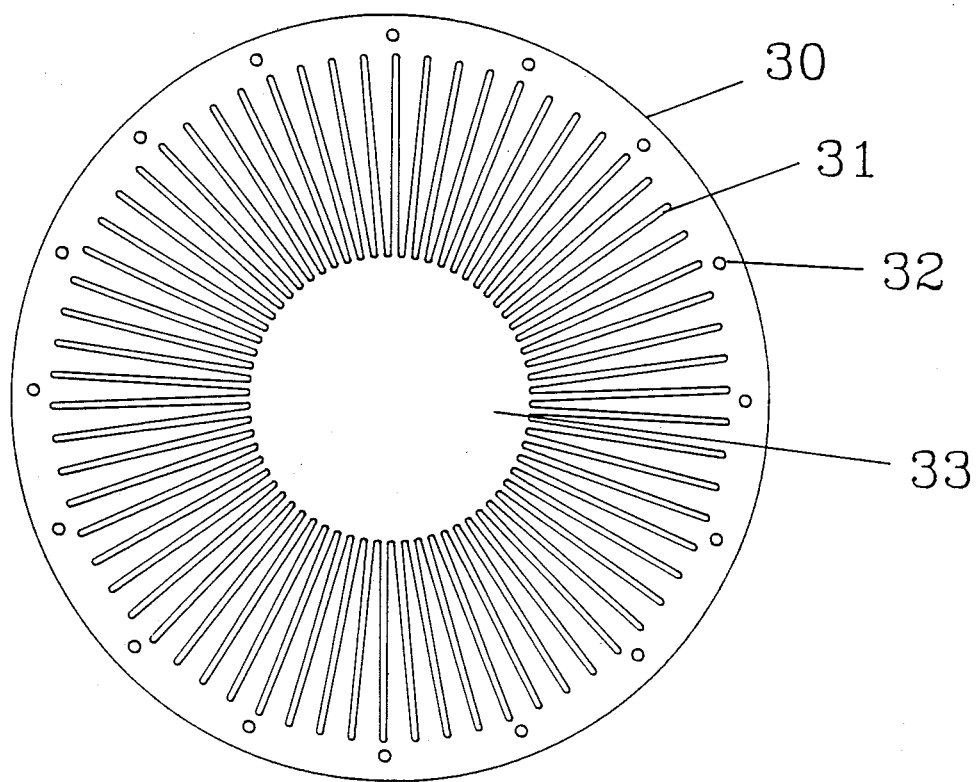
FIG. 2 illustrates a ring card used with the elastomer connector.

FIG. 2 illustrates the ring card 30 on which a plurality of elas&omer connectors are mounted. Ring card 30 has a plurality of connector slots evenly distributed around the ring card. The elastomer connectors reside in the slots 31 and are placed in the slots by sliding the connector from the central opening 33 onto the slot 31. Central opening 33 is provided, in part for center post 13, FIG. 1.

FIGS. 3a, 3b and 3c show a top, end and side view of an elastomer connector 40. The connector 40 has an elastomer core 40a around which is mounted conductors 41. The conductors do not extend completely around the elastomer core, but are only on three sides. The fourth side has an opening or slot 42. Slot 42 is used, in part, to hold the connector on ring card 30.

Figure 4:
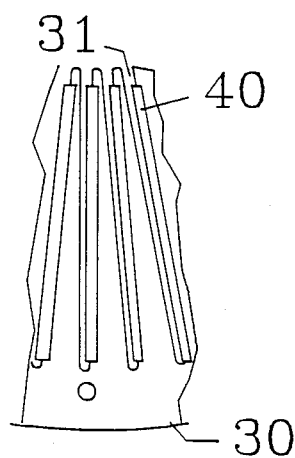
FIG. 4 illustrates a segment of a ring card with elastomer connectors mounted thereon.

FIG. 4 is a partial view of ring card 30 with connectors 40 mounted in slots 31. Connectors 40 are held in position by a retainer illustrated in FIG. 5.

FIG. 5 shows a cross-sectional view illustrating the elastomer connector 40 in the ring card 30, and connecting the pin electronics card 12 with the probe card 17. Elastomer connector 40 is held in position by an elastomer back-up retainer 44 and a positioner 43. Positioner 43 is of an insulating material since it may come into contact with conductors 41 on connector 40. Positioner 43, in practice, may contact both ring card 30 and connector 40 holding it rigidly in slot. In FIG. 5, to clearly illustrate the parts, space is shown between each of the parts ring card 30, elastomer backup 44 and positioner 43, but in practice, each of these part would be in rigid contact to hold connector 40 in position in slot 31.

FIG. 5a is an enlarged view of the conductors 41 on elastomer connector 40 and card contacts 46, illustrating that the contacts 46 may contact several conductors 41, but are not shorted together since each conductor 41 on connector 40 is electrically separate from the others.

The impedance of the connector 41 may be varied by providing a metal layer on one side of elastomer backup 44. Also, by varying the distance of the metalized elastomer backup 44 from the conductors 41 on the opposite side of connector 40, the impedance of the connector may be varied. The impedance can also be varied by changing the size of the contacts 46 on the pin electronics board 12 and DUT interface board, thereby changing the number of elastomer conductors 41 connecting the contacts 46 on the pin electronics board.

Although not illustrated, probe card 17 will have contacts similar to contacts 46 on pin electronics card 12 to interconnect the connector 40 with probe card 17.

What is claimed:

1. A connector assembly for connecting a semiconductor electronics card with a device under test interface board, comprising;
   a mounting card for mounting at least one connector;
   an elastomer connector having electrical circuit paths thereon for connecting said electronics card with said device under test mounted on said mounting card;
   an elastomer support part for holding the elastomer connector in a fixed position on said monting card; and
   a retainer part having a metalized surface thereon mounted between the elastomer connector and mounting card for providing support for the elastomer connector.

2. The connector assembly according to claim 1, wherein the metalized surface on the retainer part in combination with the elastomer connector provides an adjustable impedance for the connector.

3. The connector assembly according to claim 1, wherein the mounting card has a circular configuration and has a plurality of slots for mounting elastomer connectors, said slots arrayed radially around the card.

4. A connector assembly for connecting a semiconductor electronics card with a device under test interface board, comprising;
   a mounting card for monting at least one connector;
   an elastomer connector having a plurality of electrical circuit paths thereon for connecting said electronics card with said device under test;
   an elastomer support part for holding the elastomer connector in a fixed position on said mounting card; and
   a retainer part mounted between the elastomer connector and mounting card such that the impedance of the connector may be varied by varying the spacing between the retainer and the conductors on the connector.

5. The connector assembly according to claim 4, wherein the retainer part has a metalized surface.

6. The connector assembly according to claim 4, wherein the mounting card has a circular configuration and has a plurality of slots for mounting elastomer connectors, said slots arrayed radially around the card.

7. The connector assembly according to claim 4, wherein the elastomer connector is mounted such that contact is made to the connector on two sides of the mounting card.

* * * * *